United States Patent
Radu et al.

(10) Patent No.: US 12,198,983 B2
(45) Date of Patent: Jan. 14, 2025

(54) METHOD FOR PRODUCING A COMPOSITE STRUCTURE COMPRISING A THIN LAYER OF MONOCRYSTALLINE SiC ON A CARRIER SUBSTRATE OF POLYCRYSTALLINE SiC

(71) Applicant: Soitec, Bernin (FR)

(72) Inventors: Ionut Radu, Crolles (FR); Hugo Biard, Grenoble (FR); Christophe Maleville, Lumbin (FR); Eric Guiot, Goncelin (FR); Didier Landru, Le Champ-près-Froges (FR)

(73) Assignee: Soitec, Bernin (FR)

( * ) Notice: Subject to any disclaimer, the term of this patent is extended or adjusted under 35 U.S.C. 154(b) by 370 days.

(21) Appl. No.: 17/756,615

(22) PCT Filed: Oct. 26, 2020

(86) PCT No.: PCT/FR2020/051928
§ 371 (c)(1),
(2) Date: May 27, 2022

(87) PCT Pub. No.: WO2021/105575
PCT Pub. Date: Jun. 3, 2021

(65) Prior Publication Data
US 2023/0260841 A1      Aug. 17, 2023

(30) Foreign Application Priority Data
Nov. 29, 2019   (FR) ........................... 1913553

(51) Int. Cl.
*H01L 21/78* (2006.01)
*C23C 16/32* (2006.01)
(Continued)

(52) U.S. Cl.
CPC ........ *H01L 21/7813* (2013.01); *C23C 16/325* (2013.01); *C30B 25/20* (2013.01);
(Continued)

(58) Field of Classification Search
CPC ........... H01L 21/7813; H01L 21/02079; H01L 21/02378; H01L 21/02447;
(Continued)

(56) References Cited

U.S. PATENT DOCUMENTS

| | | |
|---|---|---|
| 5,037,502 A | 8/1991 | Suzuki et al. |
| 7,851,330 B2 | 12/2010 | Dupont |

(Continued)

FOREIGN PATENT DOCUMENTS

| | | |
|---|---|---|
| CN | 104051242 A | 9/2014 |
| DE | 102014103518 A1 | 9/2014 |

(Continued)

OTHER PUBLICATIONS

Boisselier, Guilhaume, Thesis titled Chemical vapour deposition of chromium, silicon and hafnium carbides, assisted by pulsed liquid injection, (2013), 172 pages.

(Continued)

*Primary Examiner* — Robert G Bachner
(74) *Attorney, Agent, or Firm* — TraskBritt

(57) ABSTRACT

A method of producing a composite structure comprising a thin layer of monocrystalline silicon carbide arranged on a carrier substrate of silicon carbide comprises: a) a step of provision of an initial substrate of monocrystalline silicon carbide, b) a step of epitaxial growth of a donor layer of monocrystalline silicon carbide on the initial substrate, to form a donor substrate, c) a step of ion implantation of light species into the donor layer, to form a buried brittle plane delimiting the thin layer, d) a step of formation of a carrier substrate of silicon carbide on the free surface of the donor layer, comprising a deposition at a temperature of between 400° C. and 1100° C., e) a step of separation along the buried brittle plane, to form the composite structure and the remainder of the donor substrate, and f) a step of chemical-mechanical treatment(s) of the composite structure.

20 Claims, 3 Drawing Sheets

(51) Int. Cl.
*C30B 25/20* (2006.01)
*C30B 29/36* (2006.01)
*C30B 31/22* (2006.01)
*C30B 33/10* (2006.01)
*H01L 21/02* (2006.01)

(52) U.S. Cl.
CPC .............. *C30B 29/36* (2013.01); *C30B 31/22* (2013.01); *C30B 33/10* (2013.01); *H01L 21/02079* (2013.01); *H01L 21/02378* (2013.01); *H01L 21/02447* (2013.01); *H01L 21/02529* (2013.01); *H01L 21/0262* (2013.01); *H01L 21/02628* (2013.01)

(58) Field of Classification Search
CPC ........... H01L 21/02529; H01L 21/0262; H01L 21/02628; H01L 21/02002; H01L 21/76254; H01L 21/02433; H01L 21/02658; C23C 16/325; C30B 25/20; C30B 29/36; C30B 31/22; C30B 33/10
See application file for complete search history.

(56) References Cited

U.S. PATENT DOCUMENTS

| | | | |
|---|---|---|---|
| 8,436,363 | B2 | 5/2013 | Werkhoven et al. |
| 2003/0159644 | A1 | 8/2003 | Yonehara et al. |
| 2009/0221331 | A1 | 9/2009 | Crawford et al. |
| 2013/0062628 | A1 | 3/2013 | Das et al. |
| 2014/0264374 | A1 | 9/2014 | Hecht et al. |
| 2015/0270351 | A1 | 9/2015 | Nishio et al. |
| 2018/0251910 | A1 | 9/2018 | Akiyama et al. |
| 2019/0013198 | A1 | 1/2019 | Itoh et al. |

FOREIGN PATENT DOCUMENTS

| | | |
|---|---|---|
| EP | 3168862 A1 | 5/2017 |
| JP | 01-220458 | 9/1989 |
| JP | 06-216050 A | 8/1994 |
| JP | 2007-230810 A | 9/2007 |
| JP | 2007-273524 A | 10/2007 |
| JP | 2015-002207 | 1/2015 |
| JP | 2015-005702 A | 1/2015 |
| KR | 10-2006-0052446 A | 5/2006 |
| TW | 201311946 A | 3/2013 |
| TW | 201724179 A | 7/2017 |

OTHER PUBLICATIONS

International Search Report for International Application No. PCT/FR2020/051928 dated Feb. 15, 2021, 2 pages.
International Written Opinion for International Application No. PCT/FR2020/051928 dated Feb. 15, 2021, 7 pages.
Mu et al., (Invited) Room Temperature Wafer Bonding of Wide Bandgap Semiconductors, ECS Transactions, vol. 86, No. 5, (2018), pp. 3-21.
Taiwanese Office Action and Search Report for Application No. 109135221 dated Jul. 31, 2024, 9 pages with machine translation.
Japanese Notice of Reasons for Rejection for Application No. 2022-523652 dated Aug. 13, 2024, 6 pages.
Korean Notice of Non-Final Rejection for Application No. 10-2022-701662 dated Oct. 8, 2024, 6 pages.

METHOD FOR PRODUCING A COMPOSITE STRUCTURE COMPRISING A THIN LAYER OF MONOCRYSTALLINE SiC ON A CARRIER SUBSTRATE OF POLYCRYSTALLINE SiC

CROSS-REFERENCE TO RELATED APPLICATIONS

This application is a national phase entry under 35 U.S.C. § 371 of International Patent Application PCT/FR2020/051928, filed Oct. 26, 2020, designating the United States of America and published as International Patent Publication WO 2021/105575 A1 on Jun. 3, 2021, which claims the benefit under Article 8 of the Patent Cooperation Treaty to French Patent Application Serial No. FR1913553, filed Nov. 29, 2019.

TECHNICAL FIELD

The present disclosure relates to the field of semiconductor materials for microelectronic components. It relates more particularly to a process for producing a composite structure comprising a thin layer of monocrystalline silicon carbide on a carrier substrate of crystalline, and especially polycrystalline, silicon carbide.

BACKGROUND

Interest in silicon carbide (SiC) has increased considerably over the course of recent years, since this semiconductor material is able to increase the capacity to handle energy. SiC is being increasingly widely used for the production of innovative power devices, to meet the requirements of rising fields in electronics, such as, in particular, electric vehicles.

Power devices and integrated supply systems based on monocrystalline silicon carbide are able to manage a much higher power density relative to their traditional silicon counterparts, and to do so with smaller active-zone dimensions. To limit still further the dimensions of the SiC power devices, it is advantageous to produce vertical rather than lateral components. For this to be the case, vertical electrical conduction must be allowed by the SiC structure, between an electrode arranged on the front face of the structure and an electrode arranged on the back face.

Nevertheless, monocrystalline SiC substrates intended for the microelectronics industry remain expensive and difficult to supply in large sizes. It is therefore advantageous to make use of thin-layer transfer solutions, in order to produce composite structures typically comprising a thin layer of monocrystalline SiC on a less expensive carrier substrate. A well-known thin-layer transfer solution is the SMART-CUT™ process, which is based on implantation of light ions and on assembly by direct bonding. A process of this kind enables the production, for example, of a composite structure comprising a thin layer of monocrystalline SiC (c-SiC), taken from a c-SiC donor substrate, in direct contact with a carrier substrate of polycrystalline SiC (p-SiC), which allows vertical electrical conduction. It remains difficult, nevertheless, to achieve high-quality direct bonding by molecular adhesion between two c-SiC and p-SiC substrates, since the management of the roughness and surface condition of the substrates is complex.

Various methods derived from this process are also known from the prior art. For example, F. Mu et al (ECS Transactions, 86 (5) 3-21, 2018) implement direct bonding after activating the surfaces to be joined by bombardment with argon (SAB for "surface activation bonding"): such treatment prior to bonding generates a very high density of dangling bonds, which promote the formation of covalent bonds at the assembly interface, and hence a high bonding energy. However, this method has the drawback of generating an amorphous layer at the surface of the monocrystalline SiC donor substrate, which negatively affects vertical electrical conduction between the thin layer of c-SiC and the carrier substrate of p-SiC.

Solutions have been proposed to resolve this problem, more particularly in document EP3168862, which employs an implantation of dopant species into the amorphous layer in order to restore its electrical properties. The main drawback of this approach is its complexity and hence its cost.

Also known is document U.S. Pat. No. 8,436,363, which describes a process for producing a composite structure comprising a thin layer of c-SiC arranged on a metal carrier substrate, the coefficient of thermal expansion of which is matched to that of the thin layer. This production process comprises the following steps:

forming a buried brittle plane in a c-SiC donor substrate, delimiting a thin layer between the buried brittle plane and a front surface of the donor substrate;

depositing a layer of metal, for example of tungsten or of molybdenum, on the front surface of the donor substrate to form the carrier substrate with sufficient thickness to fulfil the role of a stiffener;

separating along the buried brittle plane to form, on the one hand, the composite structure comprising the metal carrier substrate and the thin layer of c-SiC and, on the other hand, the remainder of the c-SiC donor substrate.

A production process of this kind, however, is incompatible when the material forming the carrier substrate is p-SiC, which requires deposition at temperatures greater than 1200° C. (usual temperatures for the production of p-SiC). Specifically, at these high temperatures, the growth kinetics of the cavities present in the buried brittle plane are faster than the growth kinetics of the p-SiC layer, and the thickness required for a stiffening effect is not reached before blistering starts to occur, which is associated with the deformation of the layer vertically in line with the cavities.

Irrespective of the layer transfer technique employed, a further problem arising is that of providing a composite structure comprising a thin c-SiC layer of very high quality, and more particularly devoid of extended defects (or having a very low density of such defects), which are liable to adversely affect the performance and the reliability of the power devices that are to be produced on the thin layer.

BRIEF SUMMARY

The present disclosure relates to an alternative solution to those of the prior art, and aims wholly or partly to overcome the aforementioned drawbacks. It relates, more particularly, to a process for producing a composite structure comprising a thin c-SiC layer of high quality arranged on a crystalline SiC carrier substrate.

The present disclosure relates to a process for producing a composite structure comprising a thin layer of monocrystalline silicon carbide arranged on a carrier substrate of silicon carbide. The process comprises:

a) a step of provision of an initial substrate of monocrystalline silicon carbide, b) a step of epitaxial growth of a donor layer of monocrystalline silicon carbide on the initial substrate, to form a donor substrate, the donor layer having a lower crystal defect density than the initial substrate, c) a step of ion implantation of light species into the donor layer, to form a buried brittle plane delimiting the thin layer between the buried brittle plane and a free surface of the donor layer, d) a step of formation of a carrier substrate of silicon carbide on the free surface of the donor layer, comprising a deposition at a temperature of between 400° C. and 1100° C., and defining a non-insulating interface between the donor layer and the carrier substrate, e) a step of separation along the buried brittle plane, to form the composite structure on the one hand and the remainder of the donor substrate on the other hand, f) a step of mechanical and/or chemical treatment(s) of the composite structure, to smooth the free surface of the thin layer and to correct the thickness uniformity of the composite structure.

According to other advantageous and non-limiting features of the present disclosure, taken alone or according to any technically feasible combination:

the deposition of step d) is carried out at a temperature of between 600° C. and 900° C., and even, preferably, between 700° C. and 800° C., and is based on a chemical vapor deposition technique or a sintering technique or a liquid-phase deposition technique using a solution of ceramic powder;

the deposition of step d) is a chemical vapor deposition assisted by direct liquid injection;

the deposition of step d) is a plasma-enhanced or low-pressure chemical vapor deposition;

the deposition of step d) is carried out at a rate of greater than 10 microns/hour, and even, preferably, greater than 50 microns/hour;

at the end of the deposition of step d), the carrier substrate has a thickness of greater than or equal to 50 microns, and even a thickness of greater than or equal to 100 microns;

step a) comprises the formation, on the initial substrate, of a monocrystalline conversion layer, for converting the basal plane dislocation defects of the initial substrate into threading edge dislocation defects;

the epitaxial growth step b) is carried out at a temperature greater than 1200° C., preferably of between 1500° C. and 1650° C.;

the light species implanted during step c) are selected from hydrogen and/or helium;

the separation step e) is operated at a temperature greater than or equal to the temperature of the deposition of step d);

the separation step e) is operated by applying a mechanical stress to a stack comprising the carrier substrate joined with the donor substrate;

step f) comprises simultaneous chemical-mechanical polishing of a front face and a back face of the composite structure;

the process comprises a step of heat treatment at a temperature of between 1000° C. and 1800° C., before or after step f);

the process comprises a second step g) of epitaxial growth of an additional monocrystalline silicon carbide layer on the thin layer of the composite structure;

the process comprises a step of reconditioning of the remainder of the donor substrate with a view to reusing it as initial substrate or as donor substrate;

the remainder of the donor substrate is reused at least twice as a new donor substrate.

BRIEF DESCRIPTION OF THE DRAWINGS

Other features and advantages of the present disclosure will become apparent from the following detailed description of the present disclosure, with reference to the accompanying figures, in which.

DETAILED DESCRIPTION

In the description, the same reference signs in the figures might be used for elements of the same type. The figures are schematic representations, which, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures.

Figure 1:
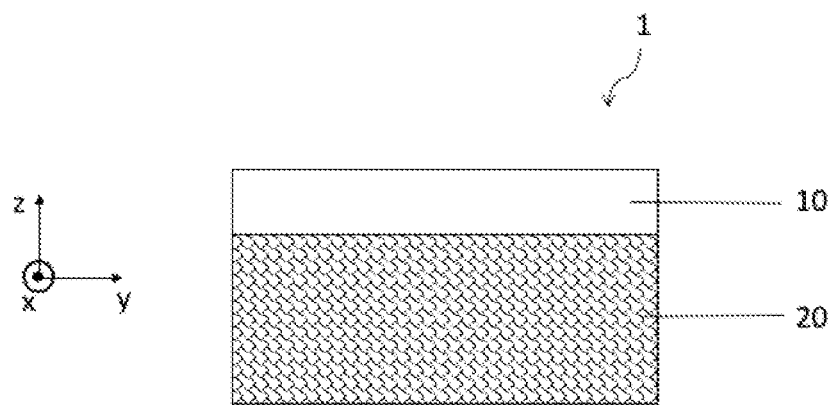
FIG. 1 shows a composite structure produced by a production process according to the present disclosure.

The present disclosure relates to a process for producing a composite structure 1 comprising a thin layer 10 of monocrystalline silicon carbide arranged on a carrier substrate 20 of silicon carbide (FIG. 1). The carrier substrate 20 is crystalline, and advantageously polycrystalline ("p-SiC" will be used hereinafter to refer to polycrystalline SiC).

Figure 2A:
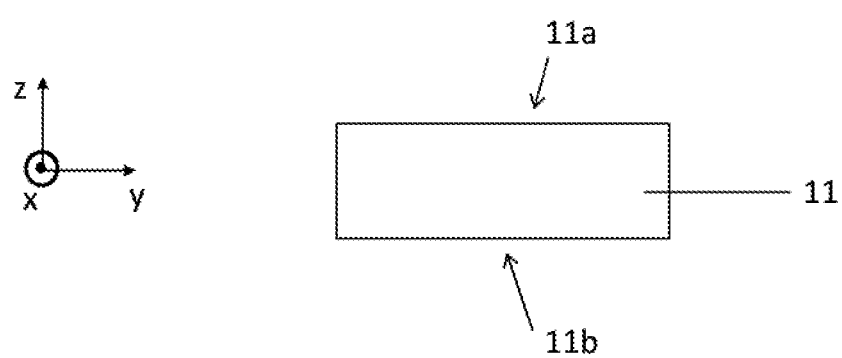
FIGS. 2a to 2g show steps of a production process according to the present disclosure.

The process first comprises a step a) of providing an initial substrate 11 of monocrystalline silicon carbide (FIG. 2a). Throughout the rest of the description, "c-SiC" will be used to refer to monocrystalline silicon carbide.

The initial substrate 11 preferably takes the form of a wafer having a diameter of 100 mm or 150 mm, or even 200 mm, and a thickness typically of between 300 and 800 microns. It has a front face 11a and a back face 11b. The surface roughness chosen for the front face 11a is advantageously less than 1 nm Ra, average roughness, measured by atomic force microscopy (AFM) on a scan of 20 microns×20 microns.

Figure 2B:
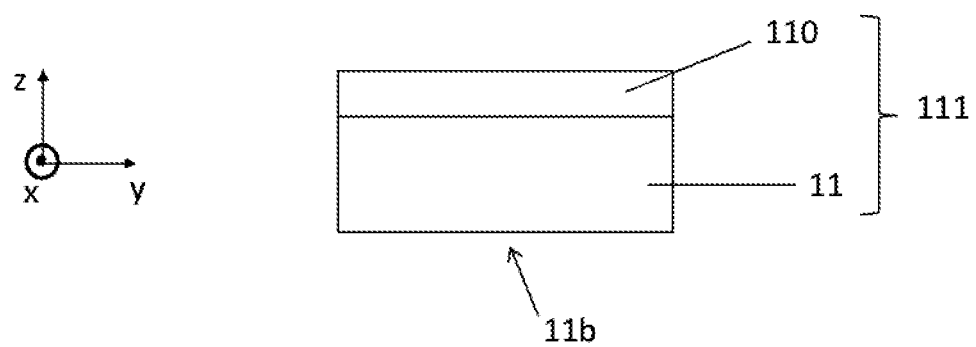

The process subsequently comprises a step b) of epitaxial growth of a monocrystalline silicon carbide donor layer 110 on the initial substrate 11, to form a donor substrate 111 (FIG. 2b). The epitaxial growth step is performed such that the donor layer 110 has a lower crystal defect density than the initial substrate 11.

The initial substrate 11 of c-SiC is typically of the 4H or 6H polytype, exhibiting a disorientation ("offcut") of less than 4.0° with respect to the <11-20> crystallographic axis±0.5°, and a threading dislocation ("micropipe") density of less than or equal to 5/cm$^2$, or even less than 1/cm$^2$. N (nitrogen)-doped, it exhibits a resistivity preferably of between 0.015 ohm·cm and 0.030 ohm·cm. The initial substrate 11 selected might have a low basal plane dislocation (BPD) defect density, typically of less than or equal to 3000/cm$^2$. Substrates of c-SiC having BPD densities of the order of 1500/cm$^2$ are reasonably available, so making it easier to supply them.

It is desirable for the donor layer 110, from which the thin c-SiC layer 10 of the composite structure 1 will be formed at the end of the process of the present disclosure, to have a higher crystal quality than the initial substrate 11, in order to comply with the required specifications for the vertical components, which are to be produced on the thin layer 10. The reason is that various types of extended defects are present in a layer or a substrate of c-SiC. These extended defects may adversely affect the performance and the reliability of the components. In particular, BPD defects are fatal to bipolar components: the reason being that a Shockley stacking fault (SSF) is extended from the dislocation when the recombination energy of an electron-hole pair is available. The expansion of an SSF stacking fault within the active region of the component gives rise to an increase in the resistance of the component in the on state.

The c-SiC donor layer 110 is therefore produced in such a way as to have a BPD defect density of less than or equal to $1/cm^2$.

For this purpose, the epitaxial growth step b) is carried out at a temperature greater than 1200° C., preferably between 1500° C. and 1650° C. The precursors used are monosilane (SiH4), propane (C3H8) or ethylene (C2H4); the carrier gas may be hydrogen with or without argon.

The low BPD defect rate in the donor layer 110 is obtained by promoting the conversion of the BPD defects present in the initial substrate 11 into threading edge dislocations or TEDs.

Figure 3A:
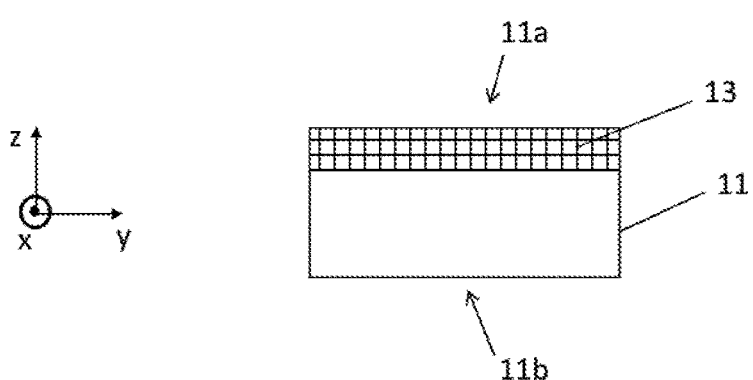
FIGS. 3a and 3b show steps of a production process according to the present disclosure.

According to one particular embodiment, step a) comprises the formation of a monocrystalline conversion layer 13, preferably of c-SiC, for maximizing the conversion of the BPD defects in the initial substrate 11 into TED defects (FIG. 3a). For this purpose, it is advantageous to select a low offcut angle of close to 4° for the initial substrate 11 of c-SiC, to enhance the in situ etching realized before the epitaxial growth, to target high growth rates (typically greater than 5 μm/h) and, lastly, to select growth conditions of the monocrystalline conversion layer 13 with a C/Si ratio in the precursor flows of close to 1.

Figure 3B:
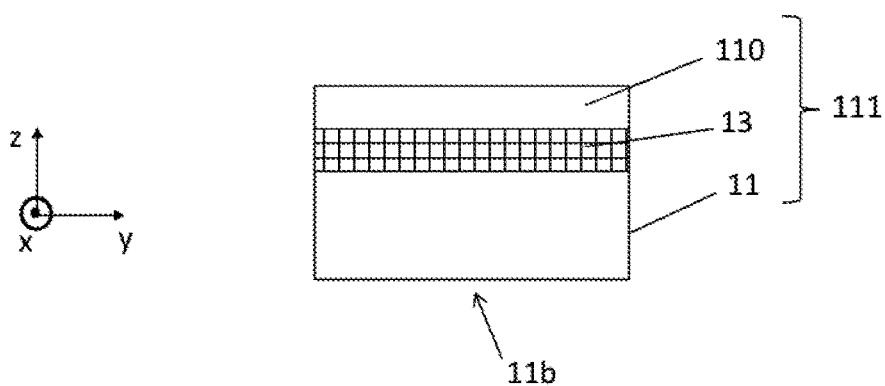

Step b) then entails performing the epitaxial growth of the donor layer 110 on the conversion layer 13 (FIG. 3b). According to this particular embodiment, it is also possible to obtain a donor layer 110 of c-SiC having a BPD defect density of less than or equal to $1/cm^2$, or even less than $0.1/cm^2$. Furthermore, the probability of bipolar degradation (the probability of a hole arriving under the BPD/TED conversion point) at the end of the process according to the present disclosure is negligible (<0.1%), since the monocrystalline conversion layer 13 is not intended for transfer into the composite structure 1. The state of the art with the aim of reducing bipolar degradations involves integrating a recombination layer (doped with nitrogen at beyond $1^E18$ at/cm$^3$) between the conversion layer and the active layer. At the expense of a thickness of 10 μm and of a concentration of greater than $5^E18/cm^3$, this recombination layer is able to reduce the probability of holes being present to 0.1%, relative to the base structure not containing this recombination layer. In the present disclosure, since the monocrystalline conversion layer 13 is not transferred, the probability of a hole reaching the nucleation point of the bipolar degradation (BPD—TED conversion point or any BPD point) is at minima less than 0.1%, or even close to 0%.

Conventional sequences of cleaning or etching of the initial substrate 11, aimed at eliminating some or all of particulate, metallic or organic contaminants, or a native oxide layer, which are potentially present on the front face 11a, may be realized prior to the epitaxial growth step b).

Figure 2C:
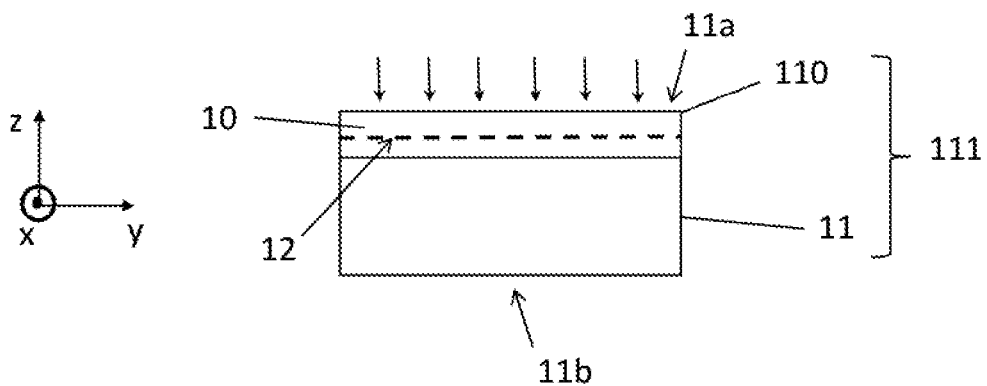

The production process according to the present disclosure further comprises a step c) of ion implantation of light species into the donor layer 110, down to a predetermined depth, which represents the desired thickness of thin layer 10, and in any case not reaching the initial substrate 11 (and/or the conversion layer 13, when the latter is present). This implantation generates a buried brittle plane 12 in the donor layer 110, which delimits the thin layer 10 between the buried brittle plane 12 and a free surface 11a of the donor layer 110 (FIG. 2c).

The light species implanted are preferably hydrogen, helium or these two species co-implanted. As is well known with reference to the SMARTCUT™ process, these light species will form, around the given depth, microcavities distributed in a thin layer parallel to the free surface 11a of the donor layer 110, i.e., parallel to the plane (x,y) in the figures. This thin layer is termed the buried brittle plane 12, for the sake of simplicity.

The energy of implantation of the light species is selected so as to reach the determined depth in the donor layer 110.

Typically, hydrogen ions will be implanted at an energy of between 10 keV and 250 keV, and at a dose of between $5^E16/cm^2$ and $1^E17/cm^2$, in order to delimit a thin layer 10 having a thickness of the order of 100 to 1500 nm.

A protective layer could be deposited on the free face of the donor layer 110, prior to the ion implantation step. This protective layer may be composed of a material such as silicon oxide or silicon nitride for example.

Figure 2D:
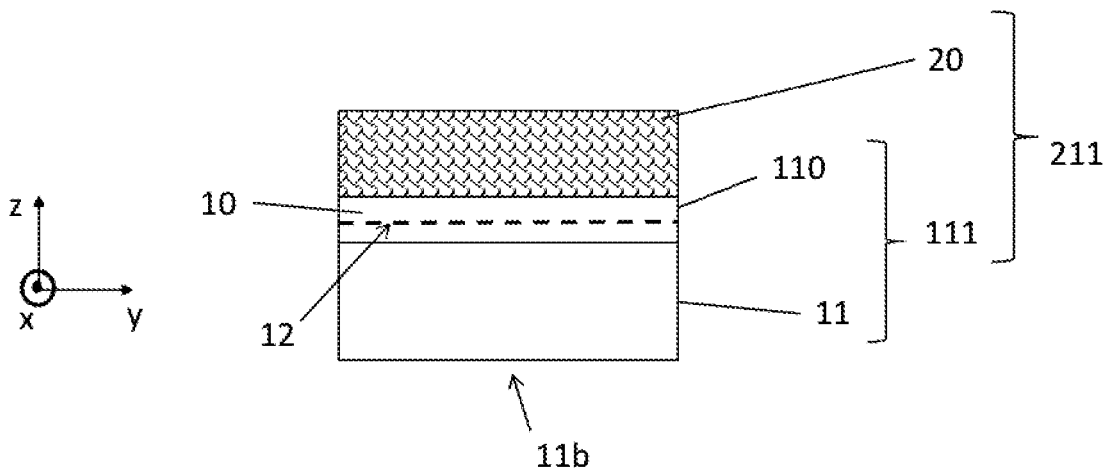

The process according to the present disclosure subsequently comprises a step d) of formation of a carrier substrate 20 of crystalline silicon carbide on the free surface of the donor layer 110 (FIG. 2d). This step d) comprises a deposition at a temperature of between 400° C. and 1100° C. The deposition of step d) is advantageously carried out at a temperature of between 600° C. and 900° C., and even, preferably, between 700° C. and 800° C.

Furthermore, step d) defines a non-insulating interface between the donor layer 110 and the carrier substrate 20. In other words, step d) is performed such that the interface between the donor layer 110 and the carrier substrate 20 is electrically conductive: the aim will be for a specific resistance of the interface of typically less than 1 mohm·cm$^2$, or even less than 0.1 mohm·cm$^2$. Advantageously, in order to ensure the electrical conductivity of the interface, the native oxide present on the free face of the donor layer 110 is removed by HF (hydrofluoric acid) deoxidization, by a wet or dry method. Alternatively, overdoping of the first few nanometers deposited on the carrier substrate 20 may promote the electrical conductivity of the interface between donor layer 110 and carrier substrate 20.

Equally advantageously, prior to the deoxidization and/or to the formation of the carrier substrate 20, cleaning sequences are applied to the donor substrate 111 in order to remove some or all of particulate, metallic or organic contaminants that are potentially present on the free faces of the substrate.

The deposition of step d) may be carried out by various techniques.

According to a first option, the carrier substrate 20 may be shaped by a sintering technique. According to this technique, an SiC powder is compacted at high temperature under a high pressure. It is possible in this way to obtain solid ceramic layers. In the context of the present disclosure, the sintering takes place directly on the implanted donor substrate 111, so that, immediately after sintering, a carrier substrate 20 is obtained, which is thick and which adheres to the donor layer 110. It is essential that the sintered material (carrier substrate 20) attains sufficient cohesion to enable the subsequent separation step e) described later on below. It is therefore necessary to lower the sintering temperature of the SiC powder below this separation temperature. For that purpose, either conventional additives are used such as boron, carbon or AlN, or SiC nanopowders are used.

According to a second option, the carrier substrate 20 may be shaped by a liquid-phase deposition technique using a solution of ceramic powder. In this case, a pre-ceramic polymer material (PDC for "polymer derived ceramics") is mixed with a ceramic powder (SiC, for example). A viscous solution is obtained, which may be deposited in layer form by spreading, spin-coating or molding. A low-temperature (~200° C.) bake leads to the polymerization and the cross-linking of the material and brings about the solidification of the layer deposited. The shaping of the carrier substrate 20 is therefore effected at low temperature. Subsequently, baking operations at higher temperatures (>600° C.) enable the pyrolysis of the polymer. The resulting material is then a pure ceramic. In the context of the present disclosure, the aim will be to obtain an SiC or SiCN material. The ceramic feedstocks are SiC in powder form, and the PDCs are molecules from the class of the polycarbosilanes or polyorganosilicones (for obtaining SiC) and polyorganosilazanes (for obtaining SiCN).

According to a third option, the deposition of step d) may be carried out by a chemical vapor deposition technique (CVD).

For example, the deposition may be performed by a thermal CVD technique such as atmospheric-pressure deposition (APCVD) or low-pressure deposition (LPCVD). The precursors may be selected from methylsilane, dimethyldichlorosilane or else dichlorosilane+isobutane.

The deposition may be a plasma-enhanced CVD technique (PECVD), with, for example, silicon tetrachloride and methane as precursors. The frequency of the source used for generating the plasma-creating electrical discharge is preferably of the order of 3.3 MHz, and more generally of between 10 kHz and 100 GHz.

The deposition of step d) may, furthermore, be based on a direct liquid injection-assisted chemical vapor deposition technique (DLI-CVD). A technique of this kind provides high yields between the substances (precursors) supplied and the deposition thicknesses attained, without any need to use chlorine-containing precursors, so limiting the costs and the environmental constraints. DLI-CVD deposition employs a disilanebutane precursor or a polysilylethylene precursor, the precursor being pure or diluted. A technique of this kind is described in the thesis by Guilhaume Boisselier (2013, "Chemical vapor deposition of chromium, silicon and hafnium carbides, assisted by pulsed liquid injection"), for applications of depositing ceramic coatings on parts, for example, metallic parts made of steel or alloys, to protect them during treatments at very high temperatures.

A deposition step d) has been developed based on the technique of DLI-CVD for an entirely different application, namely the formation of a carrier substrate 20 of SiC on a donor layer 110 of c-SiC, for producing a composite substrate intended for the microelectronics field. The parameters of the deposition (for example, pressure of 6.7 kPa, temperature between 700° C. and 850° C.) are determined such that the carrier substrate 20 exhibits good electrical conductivity, of between 0.015 and 0.03 ohm·cm, high thermal conductivity, of greater than or equal to 200 W·m$^{-1}$·K$^{-1}$, and a coefficient of thermal expansion similar to that of the thin layer 10, of typically between $3.8^E$-6/K and $4.2^E$-6/K at ambient temperature.

To obtain these properties, the carrier substrate 20 may, for example, exhibit the following structural characteristics: polycrystalline structure, 3C SiC grains, 111 orientation, 1 to 10 μm average size, N-type doping for a final resistivity of less than or equal to 0.03 ohm·cm.

Irrespective of the technique employed, the CVD deposition is advantageously carried out at a rate of more than 10 microns/hour, and even more than 50 microns/hour, and even, further, more than 100 microns/hour. As well as the obvious economic sense, it is important to reach a significant thickness of carrier substrate 20 rapidly, so as to ensure a stiffening effect with respect to the buried brittle plane 12, in which the cavities follow a thermally activated growth.

At the end of step d), the carrier layer 20 has a thickness of greater than or equal to 50 microns, or even a thickness of greater than or equal to 100 microns. The stack 211 resulting from step d) comprises the carrier substrate 20 arranged on the donor layer 110, which is in turn arranged on the initial substrate 11.

Figure 2E:
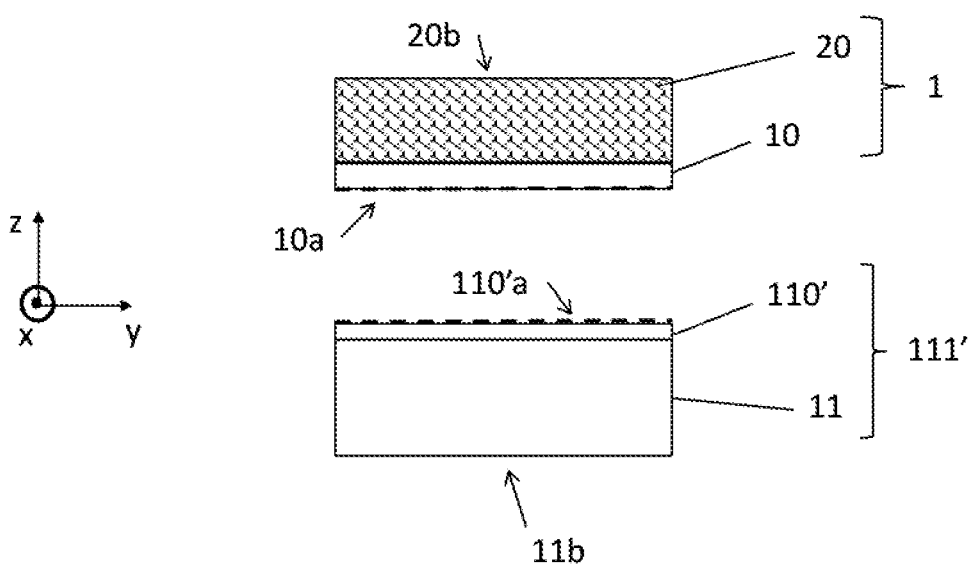

The process according to the present disclosure subsequently comprises a step e) of separation along the buried brittle plane 12, to form the composite structure 1 on the one hand and the remainder 111' of the on the other hand (FIG. 2e).

According to one advantageous embodiment, the separation step e) is operated by applying a heat treatment to the stack 211, at a separation temperature greater than or equal to the temperature of the deposition of step d). Specifically, the microcavities present in the buried brittle plane 12 follow growth kinetics until the initiation of a fracture wave, which will propagate over the entire extent of the buried brittle plane 12 and result in separation between the composite structure 1 and the remainder of the initial substrate. In practice, the temperature may be between 950° C. and 1200° C., depending on the implantation conditions of step c).

According to an alternative embodiment, the separation step e) is operated by application of a mechanical stress to the stack 211. The stress may be exerted, for example, by inserting a tool (e.g., razor blade) close to the buried brittle plane 12. As an example, the separation stress may be of the order of a few GPa, preferably greater than 2 GPa.

According to yet another embodiment, a separation step e) along the buried brittle plane 12 is performed during or directly at the end of formation of the carrier substrate 20 in step d), more particularly when the deposition temperatures in that step are in the 800° C.-1100° C. range.

As is known per se, at the end of the separation step e), the free face 10a of the thin layer 10 of the composite structure 1 has a surface roughness of between 5 and 100 nm RMS (by measurement with an atomic force microscope (AFM) on scans of 20 microns×20 microns).

Figure 2F:
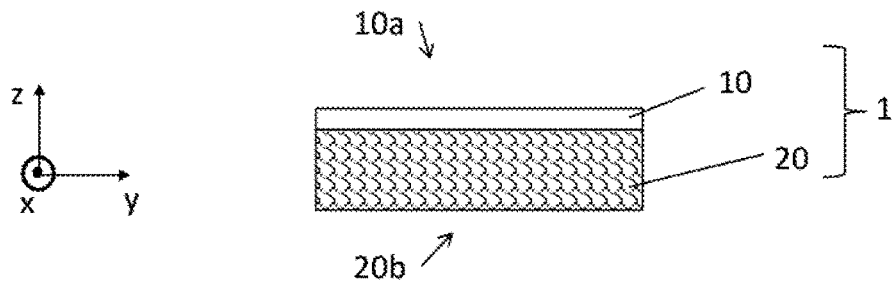

The process according to the present disclosure therefore comprises a step f) of mechanical and/or chemical treatment(s) of the composite structure 1, to smooth the free face 10a of the thin layer 10 and to correct the thickness uniformity of the composite structure 1 (FIG. 2f).

Step f) may therefore comprise chemical-mechanical polishing (CMP) of the free face 10a of the thin layer 10, typically with a removal of material of the order of 50 nm to 1000 nm, to obtain a final roughness of less than 0.5 nm Rms (on an AFM field of 20×20 μm), or even of less than 0.3 nm. Step f) may also comprise a chemical or plasma treatment (cleaning or etching), for example, an SC1/SC2 (Standard Clean 1, Standard Clean 2) cleaning and/or HF (hydrofluoric acid) cleaning, or an N2, Ar, CF4 plasma, etc., to further enhance the quality of the free face 10a of the thin layer 10.

Moreover, step f) may comprise chemical-mechanical polishing (CMP) and/or chemical treatment (etching or cleaning) and/or mechanical treatment (grinding) of the back face 20b of the carrier substrate 20, for the purpose of improving the thickness uniformity of the carrier substrate 20 and also its back face 20b roughness. A roughness of less than 0.5 nm RMS (by measurement with an atomic force microscope (AFM) on fields of 20 microns×20 microns) is desired in order to produce vertical components for which at least one metal electrode will be present on the back face 20b of the composite structure 1.

During this step f), it is also possible to carry out polishing or grinding of the edges of the composite structure 1, in order to make the shape of its circular contour and the edge rounding compatible with the requirements of the microelectronic fabrication processes.

According to one advantageous embodiment, the chemical-mechanical treatment step f) comprises simultaneous polishing (CMP) of a free face 10a and a back face 20b of the composite structure 1, to smooth and improve the thickness uniformity of the composite structure 1. The polishing parameters may differ between the front face and the back face, with the smoothing of a c-SiC surface and of a p-SiC surface commonly requiring different consumables. The emphasis more particularly is on the mechanical component of the polishing for the back face 20b when the carrier substrate 20 is made of p-SiC, in order to limit the preferential attack of the grain boundaries by the chemical component of the polishing. By way of example, the polishing parameters, such as the rotary speed (polishing head and plate), the pressure, the concentration and the physical properties of the abrasives (i.e., diameter of diamond nanoparticles between approximately ten nm and 1 μm), may be modified in order to emphasize the mechanical component.

Still according to one advantageous embodiment, step f) is preceded or followed by a step f) of heat treatment at a temperature between 1000° C. and 1800° C., for approximately one hour and up to several hours. The objective of this step is to stabilize the composite structure 1 by developing, where appropriate, the crystalline configuration of the carrier substrate 20, such that the composite structure 1 is compatible with subsequent heat treatments at high temperatures, which are required for the fabrication of components on the thin layer 10.

Figure 2G:
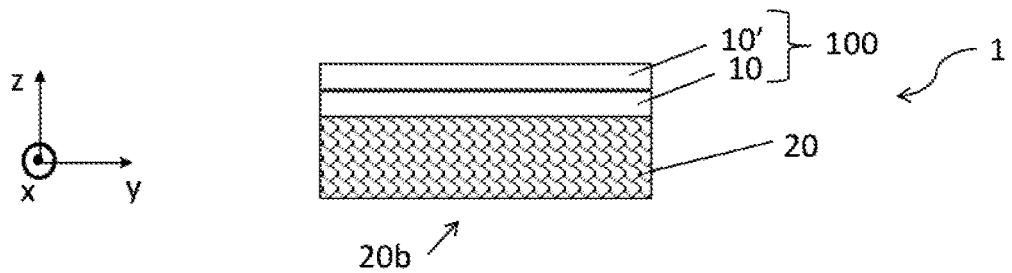

The process according to the present disclosure may comprise a second step g) of epitaxial growth of an additional layer 10' of monocrystalline silicon carbide on the thin layer 10 of the composite structure 1 (FIG. 2g). A step of this kind is applied when the thickness of a relatively substantial useful layer 100 is necessary for the fabrication of components, typically of the order of 5 to 50 microns. The epitaxy conditions may optionally be selected similar to those of step b), preferably at a lower temperature, in order to limit the stresses induced in the useful layer 100 (corresponding to the assembly of thin layer 10 and additional layer 10'), owing to the composite structure 1.

Lastly, the production process may comprise a step of reconditioning of the remainder 111' of the donor substrate with a view to reusing it as initial substrate 11 or as donor substrate 111. A reconditioning step of this kind is based on one or more treatments of the face 110'a (FIG. 2e) by edge or surface chemical-mechanical polishing, and/or by mechanical grinding, and/or by wet or dry chemical etching. The thickness of the donor layer 110 formed in step b) is preferably defined such that the remainder 111' of the donor substrate 111 can be reused at least twice as a donor substrate 111. Preferably, when the conversion layer 13 is present, care will be taken to preserve the layer intact, in other words always to preserve part of donor layer 10 on the remainder 111' of the donor substrate. Accordingly, when the part of donor substrate 111 is insufficient for producing a composite structure 1, only the step of epitaxial growth of donor layer 10 is necessary, and not the prior step of growth of the conversion layer 13.

Example 1

According to one non-limiting exemplary implementation, the initial substrate 11 provided in step a) of the production process is a wafer made of c-SiC, of 4H polytype, with an orientation of 4.0° with respect to the <11-20> axis±0.5°, with a diameter of 150 mm and with a thickness of 350 μm.

A conventional RCA cleaning sequence (Standard Clean 1+Standard Clean 2) followed by Caro's acid (mixture of sulfuric acid and hydrogen peroxide) and then HF (hydrofluoric acid) is carried out on the initial substrate 11 prior to the step b) of epitaxial growth of the c-SiC donor layer 110.

The growth is performed in an epitaxy chamber at a temperature of 1650° C. with precursors such as monosilane (SiH4) and propane (C3H8) or ethylene (C2H4), generating the c-SiC donor layer 110 with a thickness of 30 microns (rate of growth: 10 microns/h). The donor layer has a BPD defect density of the order of $1/cm^2$.

Hydrogen ions are implanted at an energy of 150 keV and a dose of $6^E 16$ H+/$cm^2$ through the free surface of the donor layer 110. A buried brittle plane 12 is thus created at a depth of about 800 nm in the initial substrate 11.

A cleaning sequence of RCA+ Caro's acid is carried out on the donor substrate 111 so as to remove potential contaminants from the free face of the donor layer 110.

DLI-CVD deposition is carried out on the donor layer 110, at a temperature of 850° C., with the precursor disilanebutane (DSB), under a pressure of 6.7 kPa, for 7 minutes, so as to reach a thickness of at least 10 microns for the carrier substrate 20. Under these conditions, the carrier substrate 20 is polycrystalline.

A 1000° C. bake is then applied to the stack 211 for 50 minutes, and separation takes place at the buried brittle plane 12 during the bake.

At the end of this separation step e), the composite structure 1, formed of the thin layer 10 and the carrier substrate 20, is separated from the remainder 111' of the donor substrate.

Double-sided polishing is carried out to restore the surface roughness of the thin layer 10 and of the back face of the carrier substrate 20.

Example 2

According to one non-limiting exemplary implementation, the initial substrate 11 provided in step a) of the production process is a wafer made of c-SiC of 4H polytype, with an orientation of 4.0° with respect to the <11-20> axis±0.5°, with a diameter of 150 mm and with a thickness of 350 μm.

A conventional RCA cleaning sequence (Standard Clean 1+Standard Clean 2) followed by Caro's acid (mixture of sulfuric acid and hydrogen peroxide) and then HF (hydrofluoric acid) is carried out on the initial substrate 11 prior to the step b) of epitaxial growth of the c-SiC donor layer 110.

The conversion layer 13 is formed in an epitaxy chamber. Before starting the epitaxial growth of this conversion layer 13 on the initial substrate 11, a hydrogen bake is performed in the chamber at a temperature of 1700° C., for a time of 10 min to 20 min. Epitaxial growth of the conversion layer 13 of c-SiC is subsequently carried out at a temperature of 1650° C., with precursors such as monosilane (SiH4) and propane (C3H8) or ethylene (C2414), and a rate of growth of approximately 6 microns/h, to reach a thickness of 1 micron. The C/Si ratio obtained from the gaseous precursors is kept around a value of close to 1, typically of between 0.95 and 1.05.

In the same epitaxy chamber, the c-SiC donor layer 110 is grown at a temperature of 1650° C., with the same precursors, but with the C/Si ratio adjusted around a value of 1.2 or substantially greater. The overall flow rate of the precursors is increased relative to the flow rates employed for the growth of the conversion layer 13, for example, the flow rates are doubled. A donor layer 10 with a thickness of 30 microns is obtained after approximately 180 min (rate of growth: 10 microns/h). The donor layer 10 has a BPD defect density of the order of, or even less than, $1/cm^2$.

Hydrogen ions are implanted at an energy of 150 keV and a dose of $6^E16$ H+/$cm^2$ through the free surface of the donor layer 110. A buried brittle plane 12 is thus created at a depth of about 800 nm in the initial substrate 11.

A cleaning sequence of RCA+Caro's acid is applied to the donor substrate 111 so as to remove potential contaminants from the free face of the donor layer 110.

PECVD deposition is carried out on the donor layer 110 at a temperature of 800° C., in an SiCl4/CH4/Ar atmosphere, with a plasma generation frequency of 3.3 MHz; the pressure within the deposition compartment is adjusted so as to reach a deposition rate of the order of 300 microns/h for the carrier substrate 20. The deposition rate must not be too high, to limit the roughness after deposition of the free surface of the carrier substrate 20. Under these conditions, the carrier substrate 20 is polycrystalline.

An 1100° C. bake is then applied to the stack 211 for 50 min, and separation takes place in the buried brittle plane 12 in the course of the bake.

At the end of this separation step e), the composite structure 1, formed of the thin layer 10 and the carrier substrate 20, is separated from the remainder 111' of the donor substrate.

Double-sided polishing is carried out to restore the surface roughness of the thin layer 10 and of the back face 20b of the carrier substrate 20.

The present disclosure is of course not limited to the embodiments and to the examples described, and variant embodiments may be introduced thereto without departing from the scope of the invention as defined by the claims.

The invention claimed is:

1. A method of producing a composite structure comprising a thin layer of monocrystalline silicon carbide on a carrier substrate of silicon carbide, the method comprising:
   a) a step of provision of an initial substrate of monocrystalline silicon carbide;
   b) a step of epitaxial growth of a donor layer of monocrystalline silicon carbide on the initial substrate, carried out at a temperature greater than 1200° C., to form a donor substrate, the donor layer having a lower crystal defect density than the initial substrate;
   c) a step of ion implantation of light species into the donor layer, to form a buried brittle plane delimiting the thin layer between the buried brittle plane and a free surface of the donor layer;
   d) a step of formation of a carrier substrate of silicon carbide on the free surface of the donor layer, comprising a deposition at a temperature of between 400° C. and 1100° C., and defining a non-insulating interface between the donor layer and the carrier substrate;
   e) a step of separation along the buried brittle plane, to form the composite structure on the one hand and a remainder of the donor substrate on the other hand; and
   f) a step of mechanical and/or chemical treatment(s) of the composite structure to smooth the free surface of the thin layer and to correct a thickness uniformity of the composite structure.

2. The method of claim 1, wherein the deposition of step d) is carried out at a temperature of between 600° C. and 900° C., and is based on a chemical vapor deposition technique or a sintering technique or a liquid-phase deposition technique using a solution of ceramic powder.

3. The method of claim 2, wherein the deposition of step d) is a chemical vapor deposition assisted by direct liquid injection.

4. The method of claim 2, wherein the deposition of step d) is a plasma-enhanced or low-pressure chemical vapor deposition.

5. The method of claim 1, wherein the deposition of step d) is carried out at a rate of greater than 10 microns/hour.

6. The method of claim 1, wherein, at the end of the deposition of step d), the carrier substrate has a thickness of greater than or equal to 50 microns.

7. The method of claim 1, wherein step a) comprises the formation, on the initial substrate, of a monocrystalline conversion layer, for converting a basal plane dislocation defects of the initial substrate into threading edge dislocation defects.

8. The method of claim 1, wherein the separation step e) is operated at a temperature greater than or equal to the temperature of the deposition of step d).

9. The method of claim 1, wherein step f) comprises simultaneous chemical-mechanical polishing of a front face and a back face of the composite structure.

10. The method of claim 1, further comprising a step of heat treatment at a temperature of between 1000° C. and 1800° C., before or after step f).

11. The method of claim 1, further comprising a step of reconditioning of the remainder of the donor substrate with a view to reusing it as initial substrate or as donor substrate.

12. The method of claim 1, wherein the epitaxial growth of step b) is carried out at a temperature between 1500° C. and 1650° C.

13. The method of claim 2, wherein the deposition of step d) is carried out at a temperature of between 700° C. and 800° C.

14. The method of claim 5, wherein the deposition of step d) is carried out at a rate of greater than 50 microns/hour.

15. The method of claim 6, wherein, at the end of the deposition of step d), the carrier substrate has a thickness of greater than or equal to 100 microns.

16. A method of producing a composite structure comprising a thin layer of monocrystalline silicon carbide on a carrier substrate of silicon carbide, the method comprising:
   providing an initial substrate of monocrystalline silicon carbide;
   epitaxially growing a donor layer of monocrystalline silicon carbide on the initial substrate at a deposition temperature of at least 1200° C. to form a donor substrate, the donor layer having a lower crystal defect density than the initial substrate;
   implanting light species ions into the donor layer to form a buried brittle plane delimiting the thin layer between the buried brittle plane and a free surface of the donor layer;
   forming a carrier substrate of silicon carbide on the free surface of the donor layer at a temperature of between 400° C. and 1100° C., and defining a non-insulating interface between the donor layer and the carrier substrate;

separating the donor substrate along the buried brittle plane to form the composite structure and a remainder of the donor substrate; and applying at least one treatment comprising a mechanical treatment and/or a chemical treatment to the composite structure to smooth the free surface of the thin layer and improve uniformity of thickness of the composite structure.

17. The method of claim 16, wherein forming the carrier substrate of silicon carbide on the free surface of the donor layer is carried out at a temperature between 600° C. and 900° C., and comprises a chemical vapor deposition process, a sintering process, or a liquid-phase deposition process using a solution of ceramic powder.

18. The method of claim 16, wherein forming the carrier substrate of silicon carbide on the free surface of the donor layer comprises chemical vapor deposition assisted by direct liquid injection.

19. The method of claim 16, wherein forming the carrier substrate of silicon carbide on the free surface of the donor layer comprises plasma-enhanced or low-pressure chemical vapor deposition.

20. The method of claim 17, wherein forming the carrier substrate of silicon carbide on the free surface of the donor layer comprises growing the carrier substrate at a rate of greater than 10 microns/hour.

\* \* \* \* \*

UNITED STATES PATENT AND TRADEMARK OFFICE
CERTIFICATE OF CORRECTION

PATENT NO. : 12,198,983 B2  
APPLICATION NO. : 17/756615  
DATED : January 14, 2025  
INVENTOR(S) : Ionut Radu et al.

Page 1 of 1

It is certified that error appears in the above-identified patent and that said Letters Patent is hereby corrected as shown below:

In the Specification

| | | |
|---|---|---|
| Column 7, | Line 7-8, | change "low-temperature (-200° C.) bake leads" to --low-temperature (~200° C.) bake leads-- |
| Column 9, | Line 32, | change "by a step f) of heat" to --by a step f') of heat-- |
| Column 11, | Line 1, | change "ethylene (C2414), and" to --ethylene (C2H4), and-- |

Signed and Sealed this  
Eighteenth Day of March, 2025

Coke Morgan Stewart  
*Acting Director of the United States Patent and Trademark Office*